(12) United States Patent
Prescher et al.

(10) Patent No.: US 8,193,815 B2
(45) Date of Patent: Jun. 5, 2012

(54) PHOTODIODE SELF-TEST

(75) Inventors: Gordian Prescher, Colonge (DE); Thomas Frach, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 328 days.

(21) Appl. No.: 12/665,871

(22) PCT Filed: May 27, 2008

(86) PCT No.: PCT/IB2008/052083
§ 371 (c)(1),
(2), (4) Date: Dec. 21, 2009

(87) PCT Pub. No.: WO2009/001237
PCT Pub. Date: Dec. 31, 2008

(65) Prior Publication Data
US 2010/0182011 A1    Jul. 22, 2010

Related U.S. Application Data

(60) Provisional application No. 60/945,998, filed on Jun. 25, 2007.

(51) Int. Cl.
*G01R 31/02* (2006.01)
(52) U.S. Cl. .......... 324/501; 324/76.11; 324/762.07
(58) Field of Classification Search .......... 324/501, 324/76.11, 762.07
See application file for complete search history.

(56) References Cited

U.S. PATENT DOCUMENTS

| 6,897,663 | B1 * | 5/2005 | Conn .......... 324/754.23 |
| 2002/0148957 | A1 | 10/2002 | Lingren et al. |
| 2006/0197174 | A1 | 9/2006 | Okumura |

FOREIGN PATENT DOCUMENTS

| EP | 1132725 A2 | 9/2001 |
| JP | 2001244446 A | 9/2001 |
| WO | 2004099865 A2 | 11/2004 |
| WO | 2006111869 A2 | 10/2006 |
| WO | 2006111883 A2 | 10/2006 |
| WO | 2006126026 A1 | 11/2006 |
| WO | 2009001237 A1 | 12/2008 |
| WO | 2009019660 A2 | 2/2009 |

OTHER PUBLICATIONS

Niclass, et al.; A Single Photon Detector Array with 64×64 Resolution Imaging and Millimetric Depth Accuracy for 3D Imaging; 2005; IEEE Solid-State Circuits Conf.; Session 19-Imagers; pp. 364, 365, 604.

McElroy, et al.; Charactenzation and Readout of MADPET-II Detector Modules: Validation of a Unique Design Concept for High Resolution Small Animal PET; 2005; IEEE Trans. on Nuclear Science; 52(1)199-204.

* cited by examiner

Primary Examiner — Vincent Q Nguyen

(57) ABSTRACT

A photodetector array (142) includes a plurality of photodetector cells (202) such as avalanche photodiodes (208) and readout circuits (210). An array self-tester (226) tests a dark count or other performance characteristic of the cells (202). The test is performed in connection with the manufacture of the array (142) or following the installation of the array (142) in a detection system (100).

19 Claims, 4 Drawing Sheets

PHOTODIODE SELF-TEST

CROSS REFERENCE TO RELATED APPLICATIONS

Figure 1:
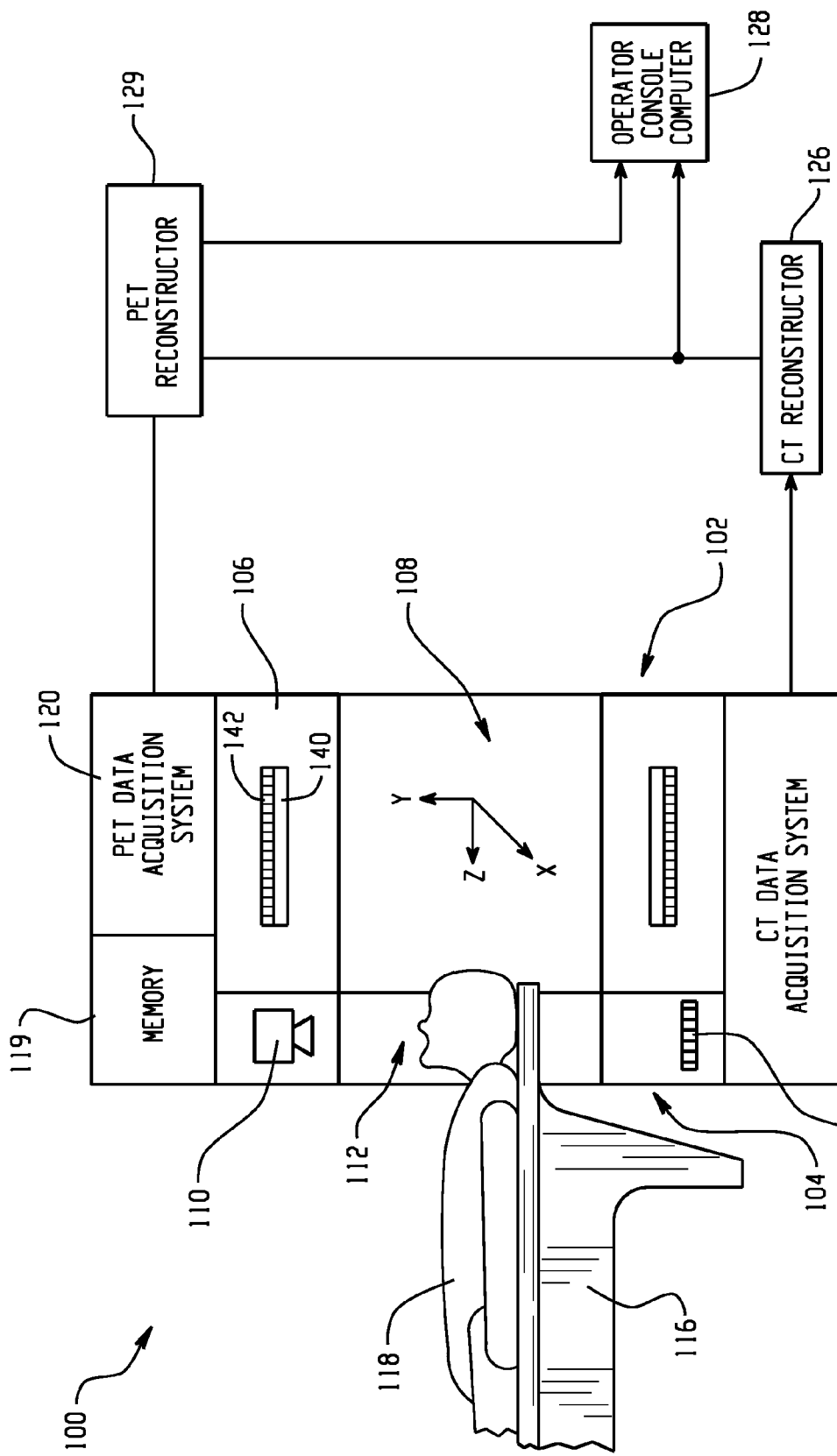

This application claims the benefit of U.S. provisional application Ser. No. 60/945,998 filed Jun. 25, 2007, which is incorporated herein by reference.

The following relates to photodiodes, and especially to arrays of Geiger-mode avalanche photodiodes. It finds particular application to detectors used in positron emission tomography (PET) and single photon emission computed tomography (SPECT) systems, optical imaging devices, and other applications in which arrays of photosensors are deployed.

Various applications in the medical and other domains rely on the detection of low level light pulses. PET systems, for example, include radiation sensitive detectors that detect temporally coincident 511 kilo electron volt (keV) gamma photons indicative of positron decays occurring in an examination region. The detectors include a scintillator that generates bursts of lower energy photons (typically in or near the visible light range) in response to received 511 keV gammas, with each burst typically including on the order of several hundreds to thousands of photons spread over a time period on the order of a few tens to hundreds of nanoseconds (ns).

Photomultiplier tubes (PMTs) have conventionally been used to detect the photons produced by the scintillator. However, PMTs are relatively bulky, vacuum tube based devices that are not especially well-suited to applications requiring high spatial resolution. More recently, silicon photomultipliers (SiPMs) have been introduced. SiPMs have included an array of detector pixels, with each pixel including on the order of several thousand APD cells connected electrically in parallel. The various APD cells are operated in the Geiger mode, with each cell including a quenching circuit. SiPMs can offer a number of advantages, including relatively compact size, good sensitivity, and good spatial resolution. Moreover, APDs and their associated readout circuitry can often be fabricated on a common semiconductor substrate. A digital SiPM including APDs and digital readout circuits is disclosed in PCT publication WO 2006/111883A2 dated Oct. 26, 2006 and entitled *Digital Silicon Photomultiplier for TOF-PET*.

As noted above, however, a typical pixel can include many APD cells. Unfortunately, APD cells having high dark counts or other faults can deleteriously affect both the APD manufacturing yield and the performance of the SiPM when installed on a scanner or other device.

Aspects of the present application address these matters and others.

According to a first aspect, a photodetector includes a semiconductor substrate and a plurality of photodetector cells fabricated on the substrate. Each cell includes an avalanche photodiode and a readout circuit. The photodetector also includes a tester fabricated on the substrate and configured to test the cells.

According to another aspect, a method includes using circuitry fabricated on a semiconductor substrate to measure a performance characteristic of a first subset of the cells of a silicon photomultiplier fabricated on the substrate. The method also includes repeating the step of using for a second subset of the cells. The first and second subsets each include a plurality of cells.

According to another aspect, an apparatus includes a plurality of avalanche photodiode cells fabricated on a semiconductor substrate. The cells include an avalanche photodiode and a cell readout circuit. The apparatus also includes circuitry fabricated on the substrate and configured to measure a performance characteristic of the photodiode cells.

According to another aspect, a method of servicing a radiation detection apparatus including a radiation detector fabricated on a semiconductor substrate is provided. The method includes using a circuit fabricated on the substrate to measure a performance characteristic of the detector and using the measured performance characteristic to service the positron imaging apparatus.

Still further aspects of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 2:
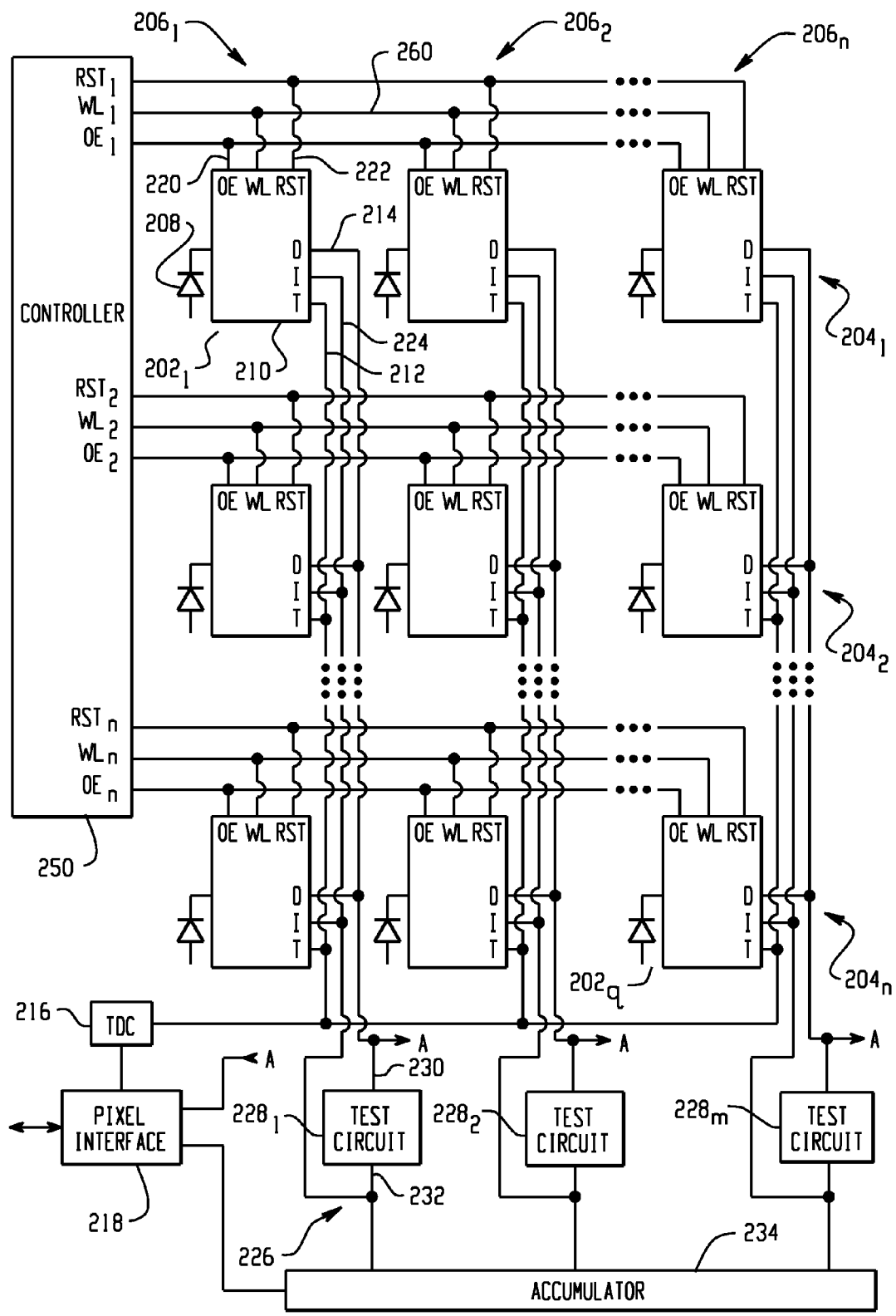
Figure 3:
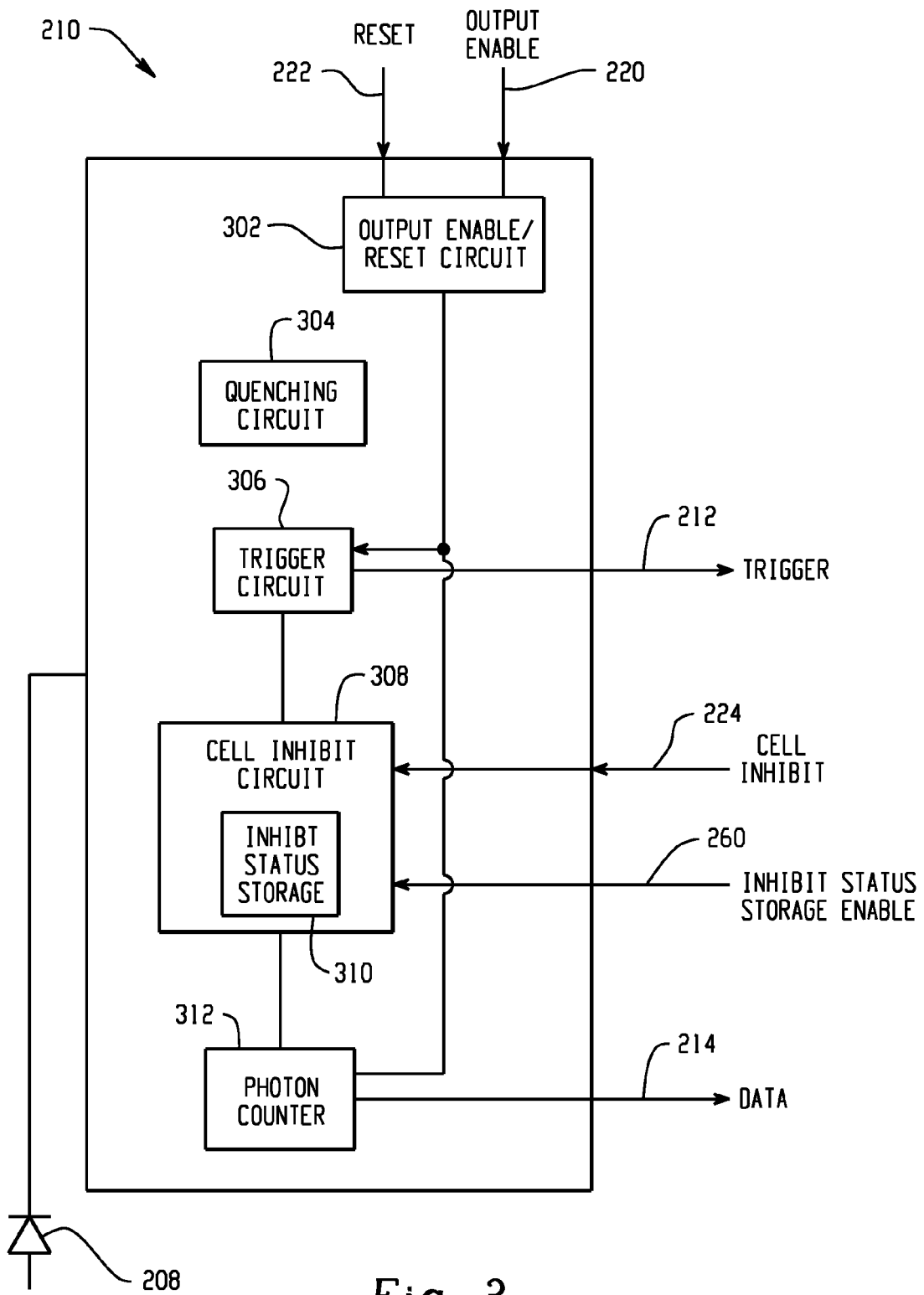
Figure 4:
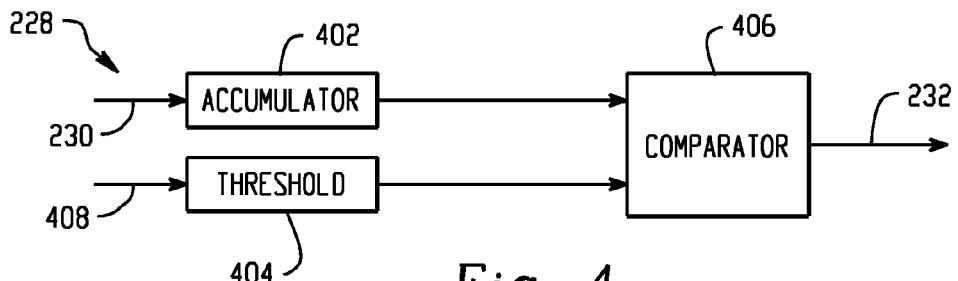
Figure 5:
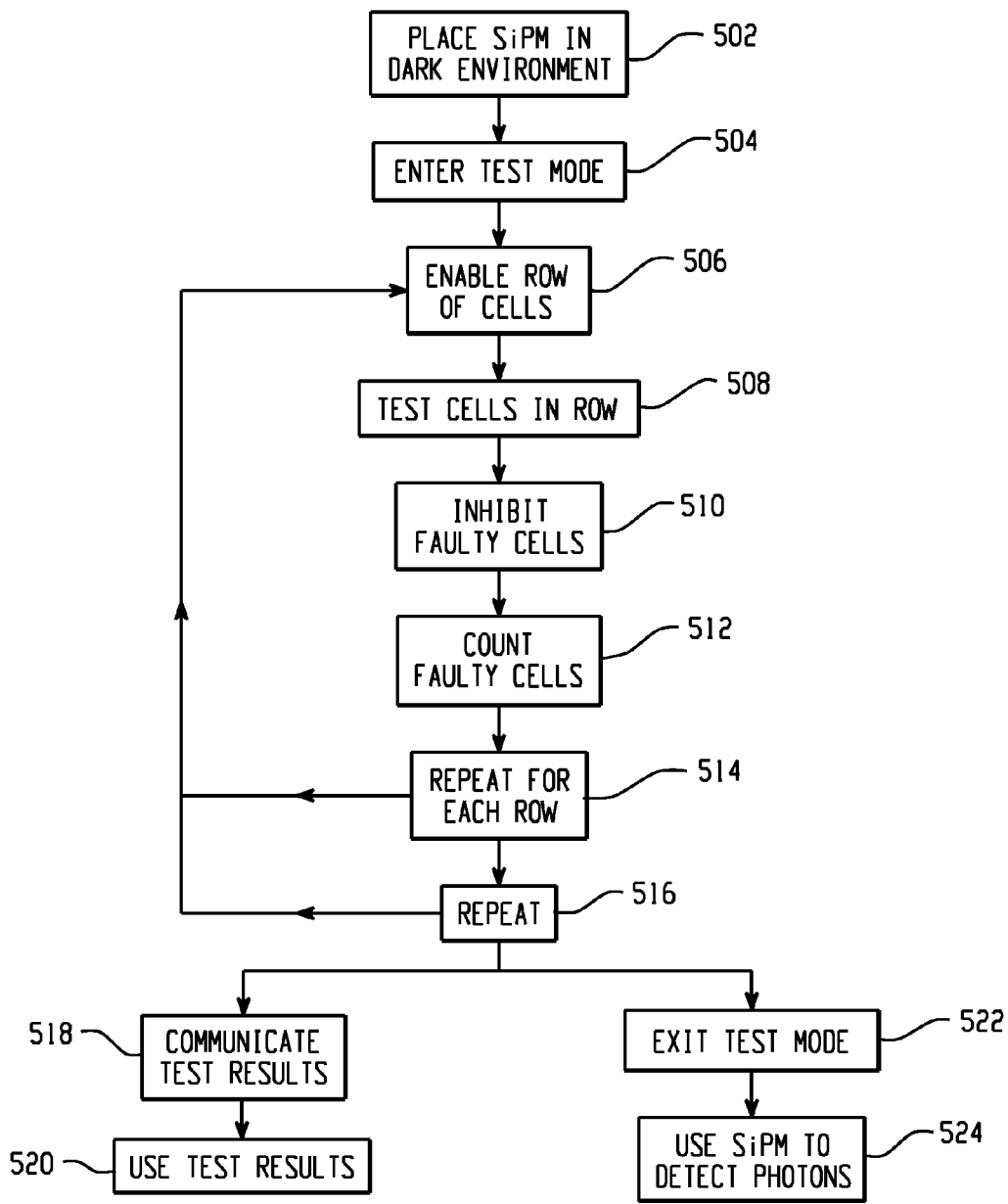

FIG. 1 depicts a PET system.
FIG. 2 depicts an SiPM.
FIG. 3 depicts a cell readout circuit.
FIG. 4 depicts a test circuit.
FIG. 5 depicts a method.

With reference to FIG. 1, a plurality of SiPM arrays 142 are employed in a system 100 such as a combined PET/CT imaging system 100. A PET gantry portion 102 of the system 100 includes a radiation sensitive detector 106 disposed about an examination region 108 in a generally annular or other suitable arrangement. A scintillator material 140 converts 511 keV gamma radiation indicative of positron annihilations into lower energy photons. The SiPM arrays 142, which are in optical communication with the scintillator material 140, convert the scintillation photons into electrical signals.

Each SiPM 142, which is fabricated on a common semiconductor substrate using complementary metal oxide semiconductor (CMOS) or other suitable fabrication technology, includes a regular or other array of photosensitive detector pixels having on the order of several thousand APD cells per pixel. The PET gantry portion 102 typically includes on the order of about 10,000 pixels. As will be described in further detail below, the SiPM arrays 142 also include integrated self-test circuitry that is used to test the APD cells, as well as inhibit logic that allows a performance of faulty cells to be inhibited. The PET system 100 may also include a memory 119 that stores an inhibit status of the APD cells.

The CT portion 104 includes a radiation source 110 such as an x-ray tube that rotates about a CT examination region 112. Radiation sensitive detectors 114 detect radiation emitted by the x-ray source which has traversed the examination region 112.

The PET gantry portion 102 and CT gantry portion 104 are preferably located in proximity with their respective examination regions 108, 112 disposed along a common longitudinal or z-axis. An object support 116 supports an object to be imaged 118 such as human patient. The object support 116 is ordinarily longitudinally movable in coordination with operation of the PET/CT system 100 so that the object 118 can be scanned at a plurality of longitudinal locations by both the PET and CT gantry portions 102, 104.

A CT data acquisition system 122 processes the signals from the CT detectors 114 to generate data indicative of the radiation attenuation along a plurality of lines or rays through the examination region 112. A CT reconstructor 126 reconstructs the data using suitable reconstruction algorithms to generate volumetric image data indicative of the radiation attenuation of the object 118.

PET data acquisition system 120 receives data from the various SiPMs and produces projection data which includes a list of annihilation events detected by the detectors 106. More particularly, the projection data provides information on the LOR for each event, such as a transverse and longitudinal position of the LOR, its transverse and azimuthal angles, and time of flight (TOF) information in the case of a TOF scanner. Alternately, the data may be rebinned into one or more sinogram or projection bins.

A PET reconstructor 129 reconstructs the PET projection data using known iterative or other techniques to generate volumetric image data indicative of the distribution of the radionuclide in the object 118. In addition, the PET reconstructor 129 also uses information from the CT reconstructor 126 to apply attenuation and other desired corrections to the PET data.

A workstation computer serves an operator console 128. The console 128 includes a human readable output device such as a monitor or display and input devices such as a keyboard and mouse. Software resident on the console 128 allows the operator to view and otherwise manipulate the volumetric image data generated by the PET and CT reconstructors 129, 126. Software resident on the console 128 also allows the operator to control the operation of the system 100 by establishing desired scan protocols, initiating and terminating scans, and otherwise interacting with the scanner.

It will be understood that the foregoing is a non-limiting example and that variations on the system 100 are also possible. Thus, for example, the CT portion of the scanner may be omitted, located remotely from the PET gantry portion 102, or replaced with another imaging device such as a magnetic resonance (MR) scanner. Different configurations of the PET detector 106 are also contemplated. Moreover, the SiPMs 142 may be employed in systems other than PET systems 100. Non-limiting examples include SPECT systems, fluorescence and optical imaging systems, high energy physics, and other medical and non-medical systems. Where the objective is to detect light radiation or other radiation having a wavelength which falls within the sensitive wavelength of the photodiodes, the scintillator 140 may also be omitted.

An example SiPM 142 pixel will now be further described with reference to FIG. 2, it being understood that the SiPM may include a number of such pixels. As illustrated, the pixel includes a plurality of detector cells $202_{1-q}$ organized in a regular or other array that includes a plurality of rows $204_{1-m}$ and/or columns $206_{1-n}$. Each cell 202 includes an APD 208 biased to operate in the Geiger mode, together with readout circuitry 210.

The readout circuit 210 generates a trigger output 212 and a data output 214. The trigger output 212 is triggered or activated to indicate that photon(s) have been detected by the APD 208. In the case of a PET or other system that measures the photon arrival times, the various trigger outputs 212 are operatively connected to a time to digital converter (TDC) 216 that generates digital timestamp data indicative of the photon arrival time, for example with respect to a common scanner or system clock. The data output 214 includes n-bit data indicative of the number of photons detected by the APD 208 during a reading period, where n is greater than or equal to 1. A pixel interface 218 transfers relevant data to and/or from upstream components of the PET data acquisition system 120.

The readout circuitry 210 also includes an output enable (or viewed conversely, an output disable) input 220, a reset input 222 a inhibit status storage enable (or viewed conversely, an inhibit status storage disable) input 260, and an inhibit input 224. The output enable input 220 enables the data output 212 in connection with the readout of the cell 202. The reset input 222 resets the cell 202 at the conclusion of a measurement period or otherwise. In the illustrated embodiment, the output enable 220 and reset inputs 222 as well as the inhibit status storage enable 260 of the various cells 202 are connected in row-wise fashion so that the cells 202 are enabled and/or reset on a row-by-row fashion. The inhibit status storage enable 260 enables writing the inhibit status storage via the inhibit input 224 so as to disable the operation of a cell 202 that is prone to excessive dark counts or that is otherwise determined to be faulty, for example by inhibiting the cell's 202 trigger 216 output.

The SiPM 142 also includes test circuitry 226 such as one or more cell test circuits $228_{1-m}$ that tests the cells 202 in the array. As illustrated, the test circuits 228 are arranged in a columnar fashion, with each test circuit 228 evaluating the performance of the cells 202 in a particular column 206. The test circuits 228 include an input 230 which, in the illustrated embodiment, receives the data 214 presented by the cells 202 in a particular column 206. The test circuits 228 also produce an evaluation output 232, which in the illustrated embodiment is operatively connected to the inhibit inputs 224 of the cells 202 in the column 206.

The evaluation outputs 232 are also received by an accumulator 234 such as one or more counters that accumulate the number of bad (or stated conversely, good) cells 202 in the pixel or other portion the array.

The SiPM also includes a controller 250 operatively connected to the data acquisition system 120. The controller 250 controls an operation of one or more pixels, for example according to a test mode in which the test circuit 226 is used to test the operation of the cells and an operating mode.

Turning now to FIG. 3, an example readout circuit 210 includes an output enable/reset circuit 302, a quenching circuit 304, a trigger circuit 306, a cell inhibit circuit 308, and a photon counter 312.

The trigger circuit 306 generates the trigger output signal 212 to indicate that photon(s) have been detected by the APD 208. The photon counter 312 counts the number of photons detected by the APD 208 in a given reading period to produce the photon count data output 214. In a 1-bit embodiment, the counter 312 is a 1-bit counter such as a latch. Also contemplated are n-bit counters, where n is greater than or equal to 2. A quenching circuit 304 such as an active or passive quenching circuit quenches the APD 208 following an avalanche.

The inhibit (or stated conversely, a cell enable) circuit 308 inhibits an operation of the cell 210, for example by disabling one or more of the APD 208, the trigger circuit 306, or the photon counter 312. The readout circuit 210 also includes an inhibit status storage device 310 such as a static random access memory (SRAM) bit, flip-flop, latch or the like that stores the inhibit status of the cell 210. The inhibit status storage enable signal 260 is used to enable writing to the inhibit status storage 310, for example in coordination with an inhibit signal received over inhibit input 224.

The output enable (or viewed conversely, disable) and reset circuit 302 resets the photon counter 312 and recharges the APD 208 in response to a signal received on a cell reset input 222. The circuit 302 also enables the photon counter data output 214 in response to a signal received at the output enable input 220.

Readout circuits and imaging systems are also described in PCT publication WO 2006/111883A2 dated Oct. 26, 2006 and entitled *Digital Silicon Photomultiplier for TOF-PET*, U.S. provisional patent application Ser. No. 60/674,034 filed Apr. 22, 2005, and U.S. provisional patent application Ser. No. 60/682,226 filed May 18, 2005, each of which is expressly incorporated by reference in its entirety herein.

Turning now to FIG. 4, an example test circuit 228 includes an accumulator 402 such a counter or adder, a threshold value 404, and a comparator 406. The accumulator 402 accumulates or otherwise counts the data received at the evaluation input 230. The comparator 406 compares the count value from the accumulator 402 to the threshold value 404 to generate an evaluation output signal 232. A reset circuit may be provided to reset the accumulator 402 following the evaluation of a given cell 202.

In one embodiment, the threshold value 404 is set at a predetermined, fixed value during the design and/or manufacture of the device. In another, the threshold value 404 is changeable via a threshold value input 408, in which case the desired threshold value (or a status bit(s) indicative of the desired value) may be stored in a memory fabricated on the SiPM 142 substrate. The desired threshold value may be established by an end user or service engineer in connection with the operation or servicing of the system 100 via the console 128 or other suitable user interface. Where the system 100 operates according to multiple scanning or imaging protocols, the threshold value 404 may also be established as a function of the selected imaging protocol, either automatically by software or firmware resident on the system, manually by a user, or otherwise.

In relatively low count rate or other applications in which detector performance is relatively unaffected by the dark count rate, for example, the threshold value 404 may be established at a relatively higher value. Conversely, the threshold value 404 may be established at a relatively lower value in applications or protocols which are relatively sensitive to dark counts. The threshold value 404 may also be automatically or otherwise adjusted as a function of a measured temperature or other variables.

It is generally advantageous to minimize the area of the readout circuits 210 of the various cells 202, as doing so tends to increase the area available for the photodiodes 208. In one embodiment, the cells 202 produce a 1-bit data output signal 212, the accumulator 402 includes an n-bit (where n is greater than 1) counter that is incremented each time a data signal is received at the evaluation input 230, and the comparison is implemented by testing the counter 402 most significant bit (MSB), for example by determining whether the MSB has been set. In another embodiment, the cells 202 produce an n-bit data signal 214, where n is greater than or equal to 2. The data 214 is read and reset a number of times during a reading period, and the accumulator 402 includes an m-bit adder that adds the various readings. By way of example, the cell 202 may include a 2-bit photon counter 312, and the adder may be implemented as a 6-bit adder.

In normal operation of the SiPM 142, a trigger signal 212 is generated when a photon is detected by one of the cells 202. A pixel readout sequence is also initiated, with the data outputs 214 being read to determine the number of photons detected during a suitable reading period. Unfortunately, however, trigger signals 212 may also be generated in response to dark photon counts. While it is possible to identify and discard the dark photon counts during operation of the system, it is generally undesirable to initiate a readout sequence in response to a dark count, as doing so tends to increase pixel dead time and therefore reduce detector performance. The issue is exacerbated as the number of cells 202 per pixel is increased.

Some cells 202 may be more prone to dark counts or otherwise faulty due to variations in the manufacturing process. Moreover, the dark count rate may also vary with the passage of time or with changes in temperature or other external parameters. In the former situation, the production variations can influence manufacturing yield; it is also desirable to assess device performance relatively early in the production process. In the latter case, it can also be beneficial to detect and/or respond to variations in the dark count rate after the SiPM 142 has been installed in the scanner 100 or other system.

Operation will now be described with reference to FIG. 5. Where the performance characteristic under test is a dark count performance, the SiPM is placed in a dark environment at step 502.

The test mode is entered at step 504.

At 506, a row 204 or other desired group of cells 202 is enabled.

At 508, the cells 202 in the row 204 are tested. Thus, for example, the dark photon count rate for each cell is measured and compared against a threshold value. Those cells 202 having a dark count rate that exceeds the threshold are identified as faulty.

At 510, an operation of those cells 202 identified as faulty is inhibited, for example by inhibiting a trigger output of the identified cells 202.

The number of faulty cells 208 is accumulated or counted at 512.

At 514, the process is repeated until each of the desired rows 204 or groups has been tested. Note that testing may also be terminated earlier where the number of faulty cells 202 exceeds a desired value.

At 516, the process may be repeated, with the test being performed a desired plurality of times. Such repetition is particularly beneficial in dark count rate or other measurements in with the measured values are subject to statistical variations. Where the SiPM has been installed in PET 100 or other system that includes a plurality of SiPMs, the various SiPMs are preferably tested temporally in parallel.

At 518, a result of the test is communicated to a device or system external to the SiPM 142, for example to a data acquisition system or circuit portion that is not fabricated on the SiPM 142 substrate.

The test results are utilized at 520, with the nature of action depending on factors such as the SiPM 142 lifecycle stage and the nature of the test performed.

For example, the testing may be performed as a part of the SiPM 142 wafer fabrication and/or production process. In such a situation, the number of faulty cells may be compared to against one or more thresholds, with the SiPMs 142 being discarded or graded for use in applications that are relatively less sensitive to the identified fault. Where the SiPM 142 includes a plurality of pixels, an aggregate number of faulty cells or pixels may also be determined, with the SiPM 142 discarded or graded accordingly.

SiPMs may be tested following their installation in a PET scanner 102 or other system, either as part of system manufacturing testing or various times during the operational lifetime of the system. For example, the testing may be performed in connection with a power up initialization process, the installation and commissioning of the system at health care facility such as a clinic, hospital or diagnostic imaging center, or other end user location, in preparation of scan or other system operation, in connection with diagnostic or other service, or otherwise. In such a case, the test results may be suitably communicated to an operator, technician, or other user. The test results may then be evaluated and used to repair the system, for example by replacing faulty SiPMs or other field replaceable units (FRUs). To facilitate a relatively more graceful failure, the system 100 may also be configured to operate only in those operating mode(s) or protocols in which performance is not unduly degraded.

Especially where the SiPM 142 has been installed in a system, the test mode is exited at 522, and the SiPM 142 is placed in an operating mode.

The SiPM 142 is used to conduct an imaging or other examination at step 524.

Variations and alternatives are contemplated. For example, the circuit 226 may be configured to measure performance characteristics other than dark count rate, and information derived from the test may be used for purposes other than inhibiting an operation of the cells 202. Thus, for example, the circuit 226 may be configured to measure a cell 202 gain or other parameter, with the information being used to adjust an operation of the cells or to adjust an output produced by the cell.

Different numbers and configurations of the test circuits 228 are also contemplated, as are alternative test circuit 228 multiplexing schemes. For example, a single test circuit 228 may be provided; a test circuit 228 may be provided for each cell 202. Two or more rows 204 may also be tested concurrently. It will be understood that the term column has been illustrated in connection with vertical columns and the term row has been illustrated in connection with horizontal row for consistency of explanation, and that the cells may be grouped in other than horizontal rows and vertical columns. Moreover, the cells 202 need not be grouped in rows and columns, and may be grouped in other suitable configurations or arrangements.

Note also that the inhibit status of the various cells may also be stored in a memory such as a non-volatile memory 119, with the information being transferred to the cells 202 upon a system power-up or otherwise.

Though described above primarily in connection with a medical PET system, it will be understood that the SiPMs 142 may be used in other systems and applications.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Having thus described the prefered embodiments, the invention is now claimed to be:

1. A photodetector comprising:
    a semiconductor substrate;
    a plurality of photodetector cells fabricated on the substrate, each cell including an avalanche photodiode and a readout circuit;
    a tester fabricated on the substrate and configured to test the cells; wherein the readout circuit comprises an inhibit circuit that inhibits an operation of a cell as a function of a test performed by the tester, wherein the readout circuit further comprises an inhibit status storage device and the inhibit circuit inhibits the operation of a cell as a function of an inhibit status stored by the storage device.

2. The photodetector of claim 1 comprising a time to digital converter, wherein the readout circuit comprises a photon trigger circuit that triggers an operation of the time to digital converter and the inhibit circuit inhibits an operation of the trigger circuit as a function of a test performed by the test circuit.

3. The photodetector of claim 1 wherein the tester tests a dark count rate of the cells.

4. The photodetector of claim 1 comprising a first column of cells and a second column of cells, wherein the tester comprises a first test circuit and a second test circuit, the first test circuit tests a performance characteristic of cells in the first column, and the second test circuit tests the performance characteristic of cells in the second column.

5. The photodetector of claim 4 comprising a first row of cells and a second row of cells, wherein the first test circuit tests the performance characteristic of a cell in the first row during a first time period and the performance characteristic of a cell in the second row during a second time period, and wherein the first and second time periods are different.

6. The photodetector of claim 1 wherein the cells produce photon counts and the tester compares a number of counts produced by a cell to a threshold value.

7. The photodetector of claim 6 wherein the threshold value is variable.

8. The photodetector of claim 1 including an accumulator fabricated on the substrate, wherein the tester identifies faulty cells and the accumulator produces a value indicative of a number of cells identified as faulty.

9. The photodetector of claim 1 wherein the photodetector forms part of an imaging system that includes a human interface, and wherein information indicative of a result of a test performed by the tester is presented via the human interface.

10. An apparatus comprising
    a plurality of avalanche photodiode cells fabricated on a semiconductor substrate, the cells including an avalanche photodiode and a cell readout circuit;
    circuitry fabricated on the substrate and configured to measure a performance characteristic of the photodiode cells, wherein the circuitry includes a first measurement circuit and a second measurement circuit, the first circuit is configured to measure the performance characteristic of each of the cells in a first subset of the cells and the second circuit is configured to measure the performance characteristic of each of the cells in a second, different subset of the cells.

11. The apparatus of claim 10 wherein the performance characteristic includes a dark count rate and the circuitry is configured to test the dark count rate of each of the cells.

12. The apparatus of claim 10 wherein the readout circuit comprises a cell inhibit circuit that inhibits an operation of the cell in response to a measurement performed by the circuitry.

13. A photodetector comprising:
    a semiconductor substrate;
    a plurality of photodetector cells fabricated on the substrate, each cell including an avalanche photodiode and a readout circuit; and
    a tester fabricated on the substrate and configured to test the cells, wherein the plurality of photoconductor cells comprises a first column of cells and a second column of cells, wherein the tester comprises a first test circuit and a second test circuit, the first test circuit tests a performance characteristic of cells in the first column, and the second test circuit tests the performance characteristic of cells in the second column.

14. The photodetector of claim 13 wherein the readout circuit comprises an inhibit circuit that inhibits an operation of a cell as a function of a test performed by the tester.

15. The photodetector of claim 14 wherein the readout circuit further comprises an inhibit status storage device and the inhibit circuit inhibits the operation of a cell as a function of an inhibit status stored by the storage device.

16. The photodetector of claim 13 further comprising a first row of cells and a second row of cells, wherein the first test circuit tests the performance characteristic of a cell in the first row during a first time period and the performance characteristic of a cell in the second row during a second time period, and wherein the first and second time periods are different.

17. The photodetector of claim 13 wherein the cells produce photon counts and the tester compares a number of counts produced by a cell to a threshold value.

18. The photodetector of claim 13 including an accumulator fabricated on the substrate, wherein the tester identifies faulty cells and the accumulator produces a value indicative of a number of cells identified as faulty.

19. The photodetector of claim 13 wherein the photodetector forms part of an imaging system that includes a human interface, and wherein information indicative of a result of a test performed by the tester is presented via the human interface.

* * * * *